(12) United States Patent
Fietz et al.

(10) Patent No.: US 10,194,550 B2
(45) Date of Patent: Jan. 29, 2019

(54) COMPUTER SYSTEM WITH FIXING DEVICE FOR RETROFITTABLE CIRCUIT BOARD

(71) Applicant: FUJITSU LIMITED, Kawasaki-shi, Kanagawa (JP)

(72) Inventors: Ralf-Peter Fietz, Paderborn (DE); Rex Lee, Taiwan (TW); Stanley Chuang, HsinChu (TW)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/702,053

(22) Filed: Sep. 12, 2017

(65) Prior Publication Data

US 2018/0098450 A1    Apr. 5, 2018

(30) Foreign Application Priority Data

Sep. 30, 2016  (DE) .................. 10 2016 118 630

(51) Int. Cl.

| | |
|---|---|
| *H05K 7/14* | (2006.01) |
| *G06F 1/18* | (2006.01) |
| *H01R 12/70* | (2011.01) |
| *H01R 12/71* | (2011.01) |
| *H01R 13/629* | (2006.01) |
| *H01R 12/50* | (2011.01) |

(52) U.S. Cl.
CPC .......... *H05K 7/1409* (2013.01); *G06F 1/185* (2013.01); *H01R 12/7005* (2013.01); *H01R 12/712* (2013.01); *H01R 13/629* (2013.01); *H05K 7/142* (2013.01); *H05K 7/1487* (2013.01); *H01R 23/70* (2013.01)

(58) Field of Classification Search
CPC .............. G08F 1/185; H01R 13/62961; H01R 13/62994
USPC ........................................... 439/74, 157, 160
See application file for complete search history.

(56) References Cited

U.S. PATENT DOCUMENTS 4,200,900 A * 4/1980 McGeorge ............. H05K 1/141
174/138 D
4,929,185 A * 5/1990 Wong .................... F16B 35/041
361/810

(Continued)

FOREIGN PATENT DOCUMENTS

| DE | 19533569 | 8/1997 |
|---|---|---|
| DE | 10327948 | 11/2007 |

(Continued)

OTHER PUBLICATIONS

GBSR—United Kingdom IP Office Search Report dated Mar. 6, 2018 for Application No. GB1714228.2.

*Primary Examiner* — Neil Abrams
(74) *Attorney, Agent, or Firm* — Fujitsu Patent Center

(57) ABSTRACT

The application relates to a computer system including a housing, a first circuit board with at least one plug connector and a retrofittable second circuit board with at least one mating plug connector. During the retrofitting of the second circuit board a plug connection is produced. The plug connection includes at least one plug connector and the at least one mating plug connector. The computer system is characterized in that a fixing device is mounted in a region of the plug connection on the first circuit board and/or the second circuit board, which is configured to apply a force for connecting the plug connection.

10 Claims, 5 Drawing Sheets

(56) References Cited

U.S. PATENT DOCUMENTS

Figure 1:
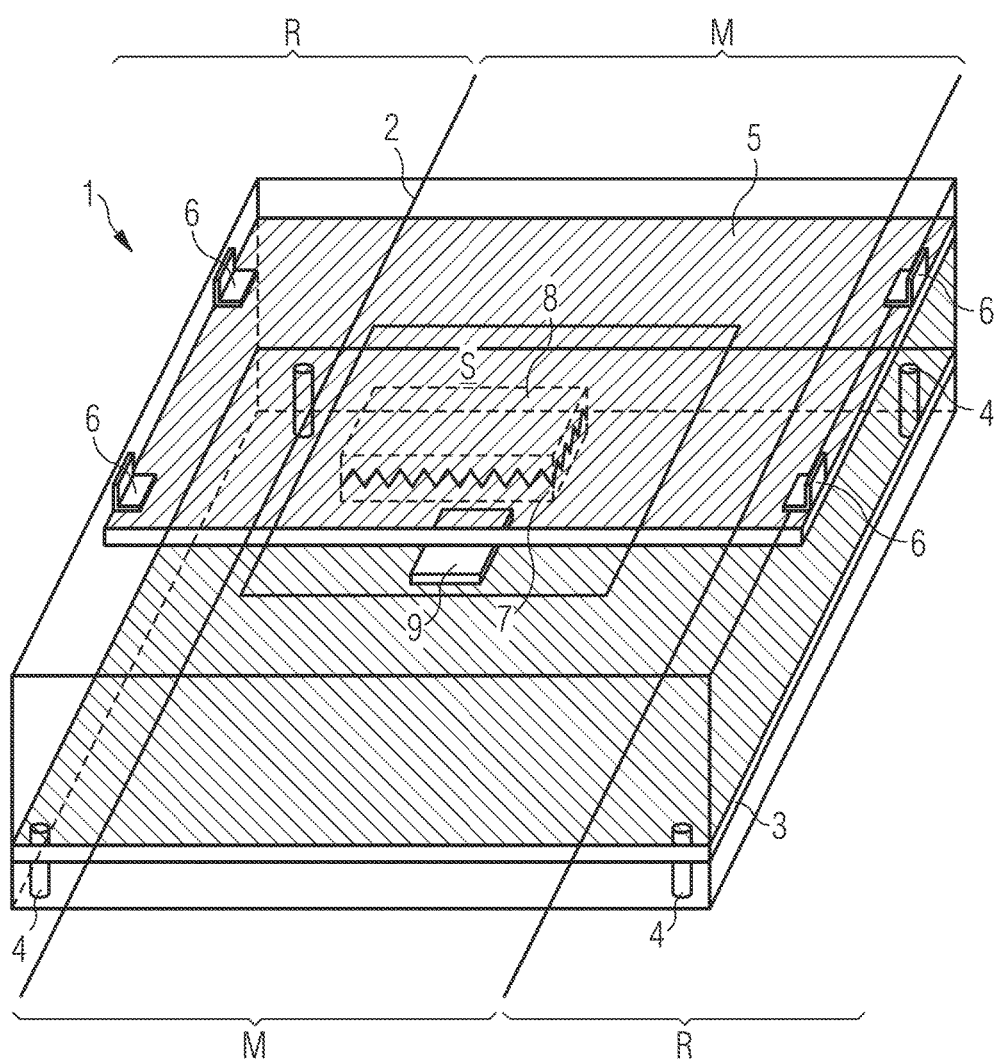

| | | | | |
|---|---|---|---|---|
| 5,136,468 A * | 8/1992 | Wong | ............... | G06F 1/184 |
| | | | | 361/679.6 |
| 5,338,214 A * | 8/1994 | Steffes | ............... | G06F 1/184 |
| | | | | 361/679.32 |
| 5,831,821 A * | 11/1998 | Scholder | ............... | G06F 1/184 |
| | | | | 361/679.32 |
| 5,841,636 A | 11/1998 | Hsu et al. | | |
| 6,039,581 A * | 3/2000 | DiMarco | ............... | H01R 12/716 |
| | | | | 439/74 |
| 6,065,989 A | 5/2000 | Walkup et al. | | |
| 6,146,176 A * | 11/2000 | Hardee | ............... | H01R 13/62933 |
| | | | | 439/310 |
| 6,276,944 B1 | 8/2001 | Klatt | | |
| 6,606,254 B2 * | 8/2003 | Yoneda | ............... | G06F 1/203 |
| | | | | 257/E23.079 |
| 6,685,489 B1 | 2/2004 | Rubenstein et al. | | |
| 6,695,634 B1 | 2/2004 | Boggs et al. | | |
| 6,781,055 B2 * | 8/2004 | Chen | ............... | H05K 7/142 |
| | | | | 174/535 |
| 6,791,843 B1 * | 9/2004 | Dobbs | ............... | H01R 13/62933 |
| | | | | 361/740 |
| 6,956,746 B2 * | 10/2005 | Barsun | ............... | H05K 7/1415 |
| | | | | 361/740 |
| 7,223,106 B2 * | 5/2007 | Nakajima | ............... | H01R 13/6215 |
| | | | | 411/178 |
| 7,740,489 B2 * | 6/2010 | Trout | ............... | H01R 12/523 |
| | | | | 439/74 |
| 8,089,770 B2 * | 1/2012 | Olesiewicz | ............... | G06F 1/185 |
| | | | | 361/752 |
| 8,089,779 B2 * | 1/2012 | Fietz | ............... | H05K 7/1487 |
| | | | | 361/740 |
| 8,366,464 B1 * | 2/2013 | Figuerado | ............... | G06F 1/185 |
| | | | | 439/160 |
| 9,122,458 B2 * | 9/2015 | Yu | ............... | G06F 1/185 |
| 9,343,831 B2 * | 5/2016 | Ozeki | ............... | H01R 12/7029 |
| 9,374,900 B2 * | 6/2016 | Huffman | ............... | H05K 1/144 |
| 9,462,719 B2 * | 10/2016 | Wu | ............... | H05K 7/1409 |
| 9,740,249 B2 * | 8/2017 | Top | ............... | G06F 1/185 |
| 2018/0098450 A1 * | 4/2018 | Fietz | ............... | H01R 13/629 |

FOREIGN PATENT DOCUMENTS

| | | |
|---|---|---|
| EP | 2757864 A2 | 7/2014 |
| KR | 100732949 B1 | 6/2007 |
| WO | 2008/014325 A2 | 1/2008 |

* cited by examiner

COMPUTER SYSTEM WITH FIXING DEVICE FOR RETROFITTABLE CIRCUIT BOARD

The present invention relates to a computer system, which includes a first circuit board having at least one plug connector and a retrofittable second circuit board having at least one mating plug-connector. When retrofitting the second circuit board, a plug connection including the at least one plug connector and the at least one mating plug-connector is established.

BACKGROUND

Nowadays, circuit boards that can be expanded by a retrofittable second circuit board are often mounted in computer systems, in particular in servers. The second circuit board is inserted in the housing of the computer system parallel to the first circuit board and connected to the first circuit board via a plug connection that establishes a physical and electronic connection between the first and the second circuit board.

The requirements for plug connections used to connect the circuit boards in the computer systems increase along with an increased performance of the computer systems. Both, more data and more power, is to be transmitted by such a plug connection. However, at the same time, the plug connections must be flexibly arrangeable in places suitable for the computer system and the circuit boards must be mountable and dismountable, as required. Despite these requirements, the plug connections are to establish a safe connection that can be connected or released without excessive efforts.

SUMMARY

The object of the present invention is to provide an improved computer system of the above type.

According to one aspect of the invention, the above object is achieved by a generic computer system which is characterized in that a fixing device is mounted in a region of the plug connection on the first and/or second circuit board. The fixing device is configured to apply a force for connecting the plug connection.

The plug connection between the first and second circuit board often has high insertion forces. When introducing the second circuit board, these insertion forces could lead to a bending or breaking of the first and/or second circuit board. The fixing device in the region of the plug connection of the first and/or second circuit board allows applying the force for connecting the plug connection in a targeted manner, so that a bending or breaking of the first and/or second circuit board is prevented in a reliable manner.

The fixing device is particularly suitable for implementation in a computer system, in which at least one of the sides of the second circuit board, when the second circuit board is retrofit, is fixed to a housing of the computer system.

A lever, which exerts the force for connecting the plug connection to the first and/or second circuit board when actuated in a first direction and which exerts the force for releasing the plug connection to the first and/or second circuit board when actuated in a second direction is particularly suitable for implementation of the fixing device.

In at least one embodiment of the invention, the fixing device includes a first rail, which is attached on the first circuit board, and/or a second rail, which is attached in the second circuit board, and the lever is connected to the first and second rails, respectively. In this case, the advantage lies with a distribution of the force for the connection of the plug connection. In this way, the lever is prevented from applying the force on the first and second circuit boards at certain points only, and thus from damaging the first and second circuit boards, respectively. Moreover, a rail provides a better point of action for the lever than does the circuit board per se, since such circuit boards are densely equipped with electronic elements in most cases and hardly offer points of action for a lever.

For implementing the lever, it is particularly advantageous that the lever comprises at least a first pin at a pivot point of the lever and at least a second pin at a load arm (German "Lastarm"; English also: "work arm") of the lever and the at least one first pin and the at least one second pin extend axially along or parallel to an axis of rotation through the pivot point of the lever.

In a further embodiment of the invention, the first rail comprises at least a first bearing, into which the at least one first pin is inserted, and the second rail comprises at least a second bearing, in which the at least one second pin is inserted. This allows safely attaching the lever and application of the force on the first and the second rail, respectively the first and the second circuit board, without that lever sliding along on the circuit board and damaging it thereby, for example.

In at least one embodiment of the invention, the at least one first pin is supported axially in the direction of the axis of rotation through the pivot point of the lever in the at least one first bearing and the lever is moveable along the axis of rotation between a first and a second position. In the first position, the at least one second pin is inserted into the at least one second bearing and, in the second position, the at least one second pin is not inserted into the at least one second bearing. This provides the advantage that, in the first position, the force for connecting or releasing the plug connection can be exerted to the second circuit board by actuation of the lever and, in a second position, the second circuit board is separated from the lever and can be removed from the computer system in this way. In both positions, the lever is connected to the first rail via the at least one first pin.

In at least one embodiment of the invention, a spring surrounds the at least one first pin, the spring generating a restoring force in the direction of the axis of rotation between the lever and the first rail, when the at least one first pin is inserted in the at least one first bearing of the first rail. This provides the advantage that the spring is tensioned when the plug connection between first and second circuit board is established. Once the plug connection is released to remove the second circuit board, the restoring force of the spring causes an automatic movement of the lever along the axis of rotation from the first into the second position and thus automatically releases the lever from the second circuit board.

According to a further embodiment of the invention, the computer system comprises a fixing device, which includes a threaded bore, which is arranged on the first circuit board, and a screw, which is arranged in the second circuit board. When screwing the screw into the threaded bore, the force for connecting the plug connection is exerted by a pretensioning force generated by the screw. The advantage of this fixing device is that the force for connecting the plug connection can be exerted in a targeted manner in the region of the plug connection. Furthermore, the fixing device is a space-saving and cost-efficient solution for applying the force for connecting the plug connection.

In particular, a captive screw is suitable for implementing the fixing device.

According to an embodiment of the invention, the screw is formed in such a way that a thread of the screw abandons a female thread of the threaded bore and the screw skids once the plug connection is established. This provides the advantage that a damage of the circuit board by strongly tightening the screw is prevented.

Further advantageous embodiments are described in the appended claims and the following description of exemplary embodiments. The exemplary embodiments are described by means of the attached figures.

FIGURES

Figure 2:
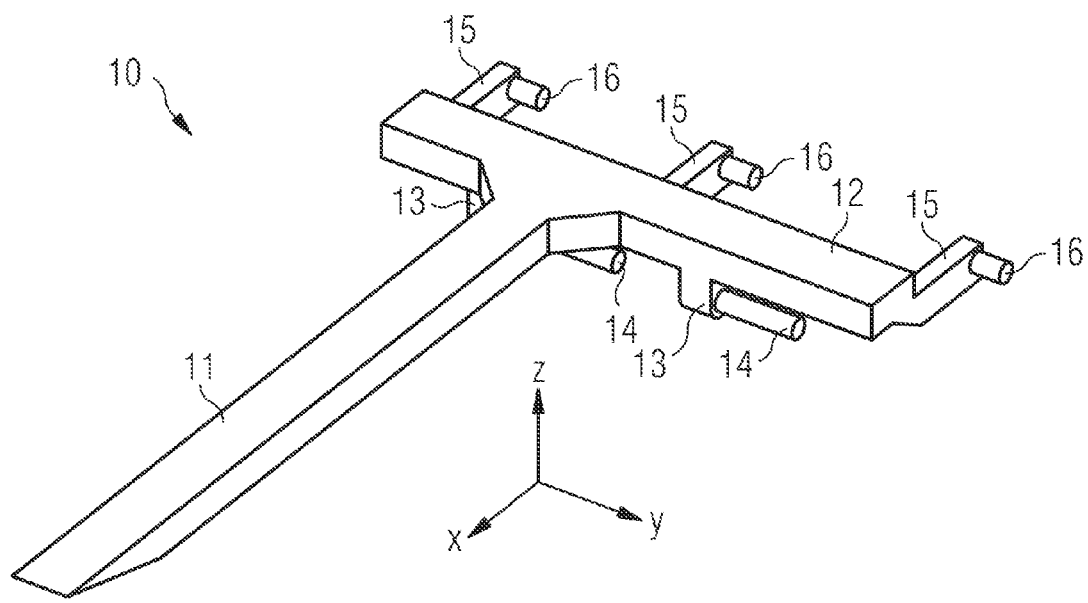
Figure 3:
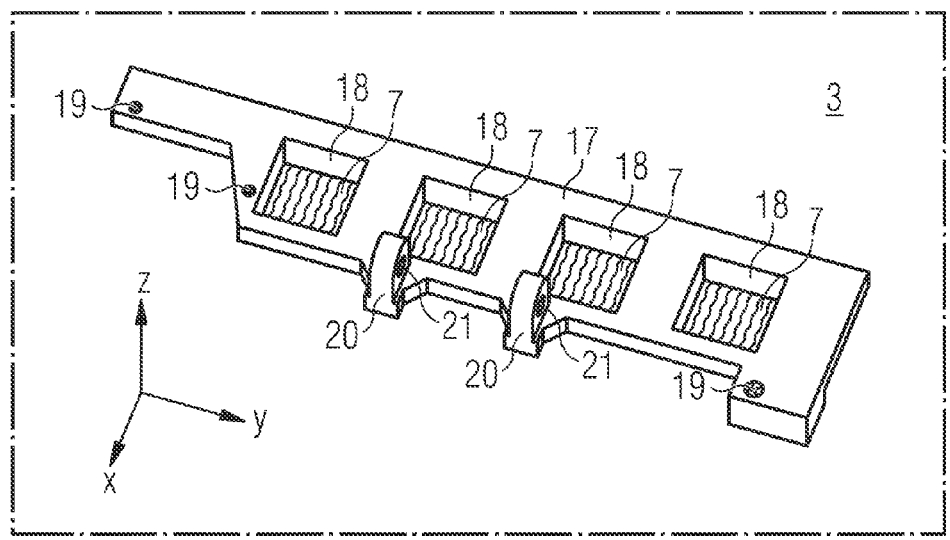
Figure 4:
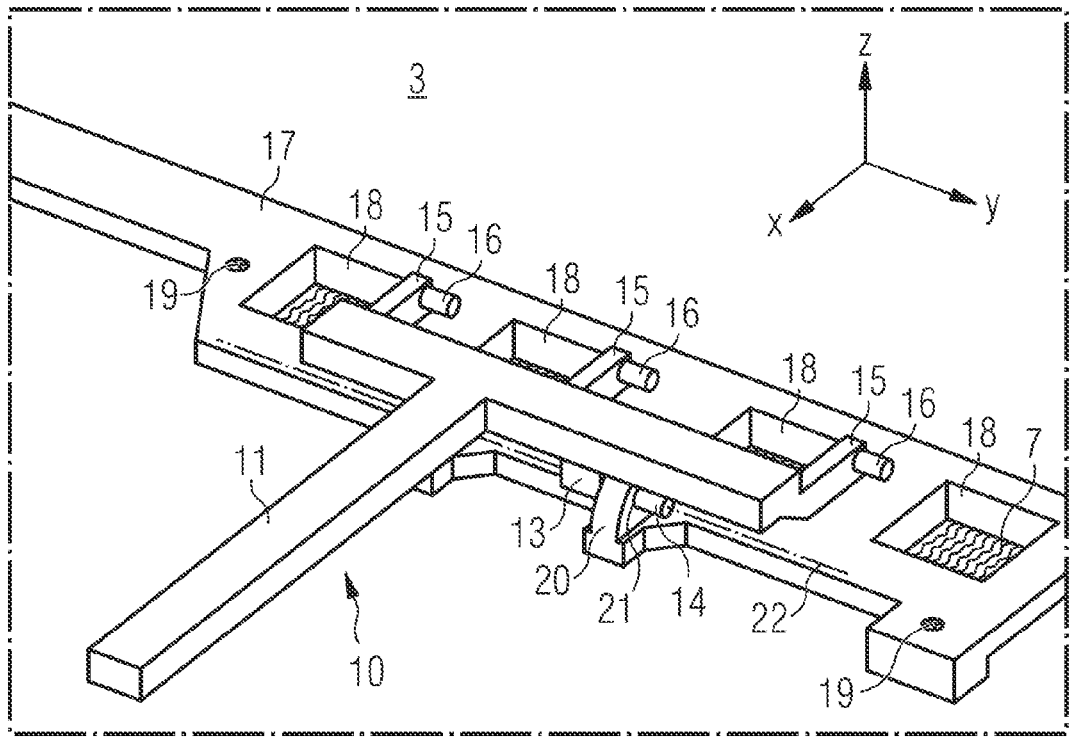
Figure 5:
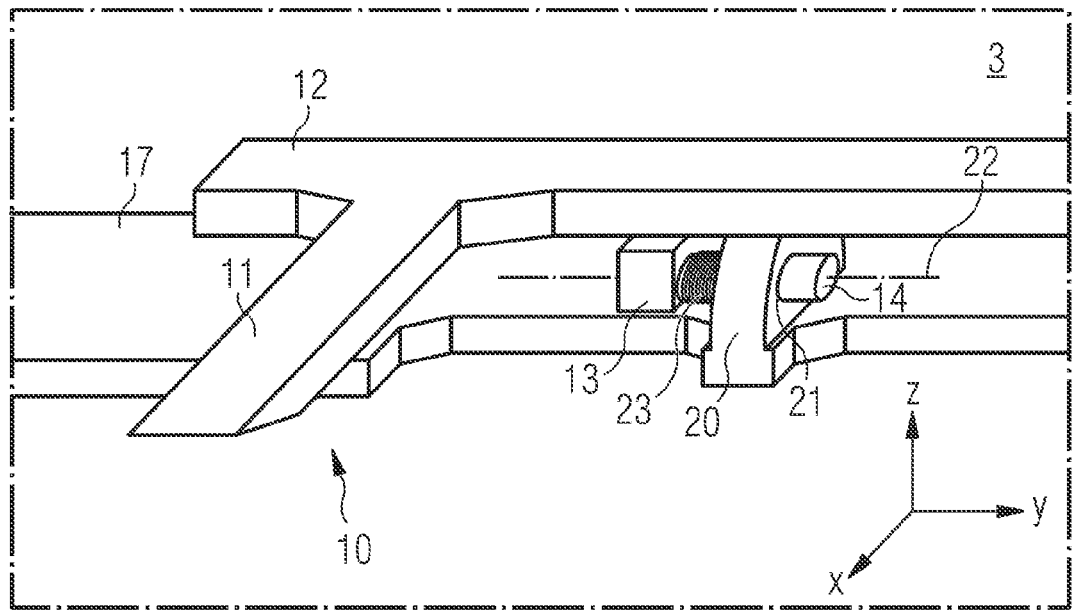
Figure 6:
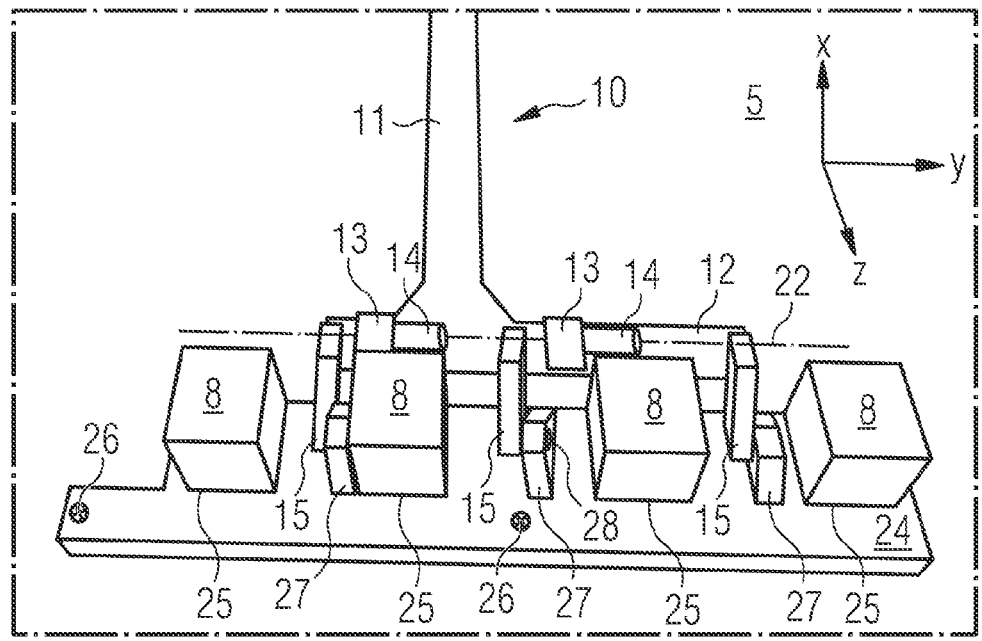
Figure 7:
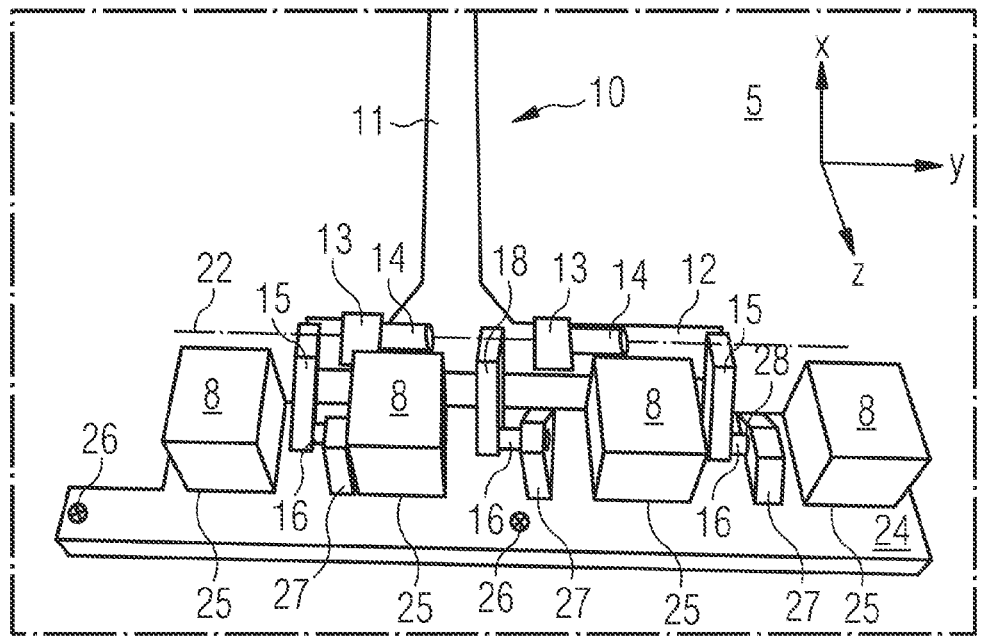
Figure 8:
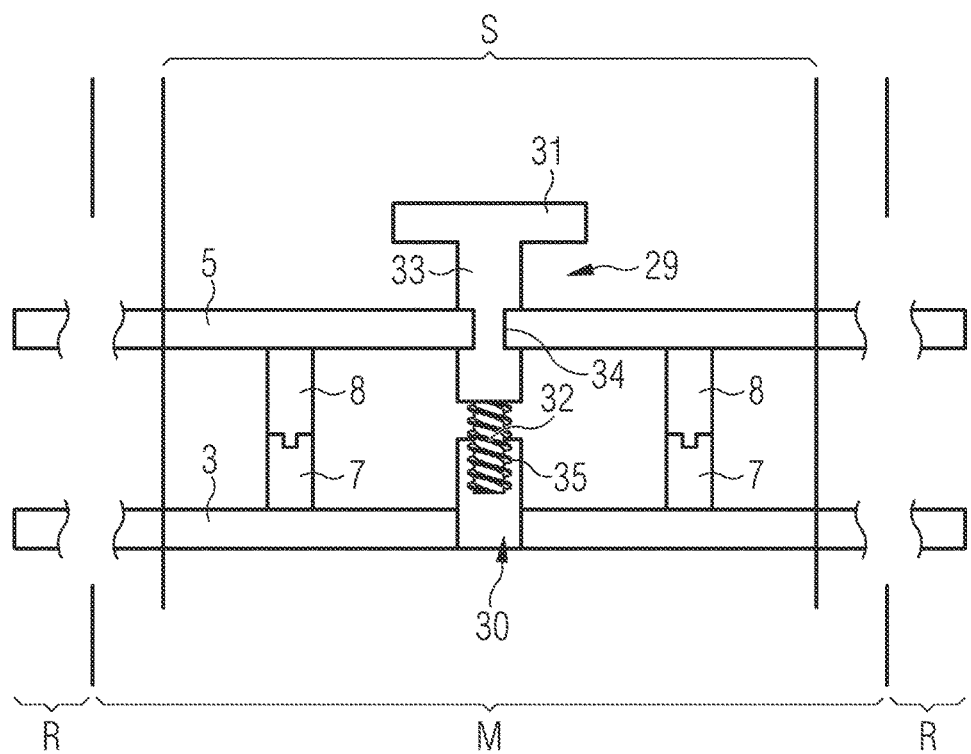
Figure 9:
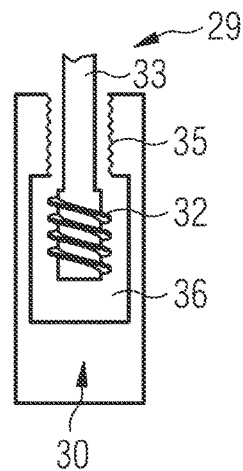

FIG. 1 shows an illustration of a computer system according to an embodiment of the invention, FIG. 2 shows an illustration of a lever according to an embodiment of the invention, FIG. 3 shows an illustration of a first rail according to an embodiment of the invention, FIG. 4 shows an illustration of an arrangement of the lever of FIG. 2 on the first rail of FIG. 3, FIG. 5 shows an illustration of the arrangement of FIG. 4 according to a further exemplary embodiment, FIG. 6 shows an illustration of an arrangement of the lever of FIG. 2 on a second rail in a first position, FIG. 7 shows an illustration of the arrangement of the lever of FIG. 2 on the second rail of FIG. 6 in a second position, FIG. 8 shows a cross-section through a fixing device of FIG. 1 according to a further embodiment of the invention, and FIG. 9 shows a cross-section through an alternative embodiment of the fixing mechanism of FIG. 8.

DETAILED DESCRIPTION

FIG. 1 shows an illustration of a computer system 1 according to an embodiment of the invention. The computer system 1 includes a housing 2, in which a first circuit board 3 is located. In this exemplary embodiment, the first circuit board 3 is connected to the housing 2 via multiple connectors 4. Furthermore, the computer system 1 includes a second circuit board 5, which can be introduced in the computer system 1 for an alternative system configuration. When retrofitting the second circuit board 5, the second circuit board is mounted in the computer system 1 via devices 6 on the edge thereof for attachment on the housing 2. A plug connector 7 is arranged in the first circuit board 3, and a mating plug connector 8 is arranged in the second circuit board.

The plug connector 7 and the mating plug connector 8 engage one another when inserting the second circuit board 5 and form a plug connection. The plug connection establishes both a physical and an electric connection between the first circuit board 3 and the second circuit board 5. In the illustrated exemplary embodiment, the plug connection is located in a central region M of the first circuit board 3 and the second circuit board 5, respectively, the devices 6 are located in a peripheral region R, just like the connector 4 of the first circuit board 3 in this example.

In the case that the force for closing and opening the plug connection would be applied merely by fixing the device 6 of the second circuit board 5 in the peripheral region R, this would result in a longer force flux through the first circuit board 3 and the second circuit board 5, respectively. Depending on the force to be applied for closing and opening the plug connection, respectively, the length of the force flux and a stability of the first circuit board 3 or the second circuit board 5, a bending of the first circuit board 3 and/or the second circuit board 5 would occur, so that the plug connection would not properly be closed or opened, or even a fracture of the first circuit board 3 and/or the second circuit board 5. The central region M describes the region of the circuit boards 3, 5 where the force for properly closing or opening the plug connection cannot in itself be applied exclusively by the device 6 for mounting the second circuit board 5 on the housing 2. The peripheral region R describes the region which is not covered by the central region M and where the device 6 is located.

In order to ensure a reliable establishment of the connection and prevent a bending or fracture of the circuit boards 3, 5, a fixing device 9 is attached in a region of the plug connection S in the exemplary embodiment according to the invention, wherein the fixing device 9 is configured to apply the force for closing or opening the plug connection. The region of the plug connection S is selected such that all points of the region of the plug connection S are located closer to the plug connection than to the peripheral region R.

FIG. 2 shows an illustration of an exemplary embodiment of a fixing device 9 of FIG. 1, according to an embodiment of the invention. In this exemplary embodiment, a lever 10 is used for applying the force for closing or opening the plug connection. The lever 10 includes a force arm 11 and a load arm 12. The force arm 11 extends in an X-direction and is formed in such a way that it can be actuated manually. The load arm 12 is formed to be significantly shorter in the X-direction than the force arm 11 in order to allow suitable force transmission. The load arm 12 extends in a Y-direction in order to provide a wide area of application for a force to be transmitted.

Two first projections 13 are arranged on the load arm 12, which extend against a Z-direction from the load arm 12. Two first pins 14 are attached on the two first projections 13, the pins extending in the Y-direction. Furthermore, the load arm 12 comprises three second projections 15 over its entire width in the Y-direction, which project from the load arm 12 against the X-direction. One second pin 16 each is arranged on each of the three second projections 15, which point in the Y-direction just like the first pins 14. In this exemplary embodiment, the first pins 14 are approximately twice as long as the second pins 16.

It is particularly suitable for the fixing device 9 in the form of the lever 10 to attach in each case one rail on the first circuit board 3 and the second circuit board 5, which are in each case fixedly connected to one of the circuit boards 3, 5 and have points of action for the lever 10 for the transmission of the force. This will be explained in greater detail hereinafter.

FIG. 3 shows an illustration of an exemplary embodiment of a first rail 17 according to an embodiment of the invention, which is arranged in a first circuit board 3. The first rail 17 comprises four first openings 18, which enclose four plug connectors 7 of the first circuit board 3. The first rail 17 is attached in the first circuit board 3 by means of three fixing screws 19. The first rail 17 further comprises two first lugs 20, which extend in a Z-direction. Each first lug 20 has a first bearing 21 in the center thereof.

FIG. 4 shows an illustration of the lever 10 of FIG. 2 and the first rail 17 of FIG. 3 in an assembled state. In this illustration, the two first pins 14 of the lever 10, one of which is discernable in this illustration only, are inserted in the two first bearings 21 of the first lugs 20 of the first rail 17. The first pins 14 are rotatably supported in the first bearings 21. The common central axis of the first pins 14 with the first bearings 21 forms a rotary axis 22 of the lever 10 pointing in the Y-direction. If the force arm 11 is moved upward when actuated in a first direction in the Z-direction, the load arm 12 lowers with the second protrusions 15 and the second pins 16. If the force arm 11 is moved downward when actuating the lever 10 in a second direction against the Z-direction, the load arm 12 is lifted with the second protrusions 15 and the second pins 16.

FIG. 5 shows an illustration of the arrangement of FIG. 4 according to a further exemplary embodiment. FIG. 5 particularly shows the pin 14 discernable in FIG. 4 on the first projection 13, which is guided through the first bearing 21 of the lug 20. In this exemplary embodiment, a helical spring 23 is arranged around the first pin 14. Before the first pin 14 enters the first bearing 21, the helical spring 23 is guided via the first pin 14 so that the spring 23 is held in the mounted state between the first projection 13 and the first lug 20. When the lever 10 is moved along the rotary axis 22 in the Y-direction, the spring 23 is compressed. A restoring force of the spring 23 causes that the lever 10 is automatically moved against the Y-direction along the rotary axis unless the lever 10 is arrested otherwise.

FIGS. 6 and 7 show the interplay between the lever 10 of the above-described exemplary embodiments and a second rail 24, which is attached on a second circuit board 5. The second rail 24 comprises four second openings 25. In the second rail 24, the openings 25 enclose four mating plug connectors 8 of the second circuit board 5. The second rail 24 is fixed to the second circuit board 5 by means of fastening screws 26. The second rail 24 comprises three second lugs 27, which extend parallel to the mating plug connectors 8, against the Z-direction. The second lugs 27 are in each case attached centrally between in each case two of the four mating plug connectors 8. The second lugs 27 each comprise a second bearing 28. The second protrusions 15 with the second pins 16 are formed in such a way that they can be inserted between the mating plug connectors 8 and the second lugs 27 and the second pins 16 can be inserted in the second bearings 28.

FIG. 6 shows the lever 10 in a first position, in which the second pins 16 are inserted in the second bearings 28, and FIG. 7 shows the lever 10 in a second position, in which the second pins 16 are released from the second bearings 28. Releasing and connecting the second pins 16 with the second bearings 28 can be effected by displacing the lever 10 in the Y-direction along the rotary axis 15, since the first pins 14, as described above, are approximately designed twice as long as the second pins 16. As an alternative, this effect can be achieved in that the first and second bearings 21, 28 have a different depth, or the first and second pins 14, 16 or the first and second lugs 20, 27 are arranged accordingly so that the lever 10 is connected to the first rail 17 via the first pins 14 and, in the first position, the second pins 16 are connected to the second rail 24 and, in the second position, the second pins 16 are not connected to the second rail 24.

The arrangement of the second lugs 27 between the mating plug connectors 8 and the design of the second protrusions 15 allows the force to act for the connection and release of the plug connection, consisting of the plug connectors 7 and the mating plug connectors 8 in the direct vicinity of the plug connection, respectively. In this way, a long force flux, as described in FIG. 1, through the first circuit board or the second circuit board 5 from a device 6 for mounting the second circuit board 5 on the housing 2 to the plug connection, which may result in a bending and or fracture of one of the circuit boards, can be prevented.

The point of action for the force for connecting or releasing the plug connection is located in a region of the plug connection S, as described in FIG. 1, in this exemplary embodiment of the fixing device 9, consisting of the lever 10, first rail 17 and second rail 24.

FIG. 8 shows a cross-section through an exemplary embodiment of a fixing device 9 of FIG. 1 according to a further embodiment of the invention. FIG. 8 shows a detail of a first circuit board 3 and a second circuit board 5 of a computer system 1 parallel to the first circuit board. A plug connection, consisting of two plug connectors 7 and two mating plug connectors 8, is arranged between the first circuit board 3 and the second circuit board 5. According to FIG. 1, the second circuit board 5 is inserted in the computer system 5 in a retrofitting process and mounted on a housing 2 of the computer system 1 via a device 6 for mounting.

A force, sufficient for closing or releasing the plug connection, is applied by the fixing device 9, including a screw 29 and a threaded bore 30, in this exemplary embodiment. The screw 29 is attached on the second circuit board 5 and the threaded bore 30 is attached on the first circuit board 3. According to FIG. 1, the fixing device 9 is located in a region of the plug connection S, in this exemplary embodiment between the plug connectors 7 and the mating plug connectors 8, respectively.

The screw 29 comprises a screw head 31 at one end, and a thread 32 at the other end. Between the screw head 31 and the thread 32, the screw 29 comprises a shank 33, which has a tapered region 34. In this tapered region 34, the screw 29 is rotatably supported in the second circuit board 5. The threaded bore 30 comprises an inner thread 35, and the thread 32 of the screw 29 can be screwed into this thread 35.

When screwing it in, the screw 29 generates a pre-tensioning force between the first circuit board 3 and the second circuit board 5. This pre-tensioning force on the circuit boards 3, 5 results in a force sufficient for connecting the plug connection to be exerted on the circuit boards 3, 5. Since the fixing device 9, consisting of screw 29 and threaded bore 30, is arranged in the region of the plug connection S, the circuit boards 3, 5 are not damaged or bent in such a way that the plug connection is not connected or released properly.

A damaging of the first circuit board 3 is prevented in the exemplary embodiment according to FIG. 8 in that the screw 29 stops against a base of the threaded bore 30 when the plug connection is established. Nevertheless, the screw 29 can be screwed into the threaded bore 30 too strongly and thus the screw per se or the inner thread can be damaged. This is prevented in the exemplary embodiment of FIG. 9, as described below.

FIG. 9 shows a cross-section through an alternative embodiment of the fixing device 9 of FIG. 8. The threaded bore 30 includes an inner thread 35 and a hollow space 36 inside the threaded bore 30, which connects to the inner thread 35. The hollow space 36 has a greater diameter than the inner thread 35. The thread 32 of the screw 29 has a diameter corresponding to the inner thread 35, so that the screw 29 can be screwed into the inner thread 35. The shank 33 of the screw 29 has a smaller diameter than the thread 32. This embodiment of the fixing device 9 allows applying the pre-tensioning force on the circuit boards 3, 5 for connecting the plug connection all the way until the plug connection is closed. In this exemplary embodiment, screwing the screw 29 too strongly is not possible because, once the plug connection has been established, the thread 32 of the screw 29 enters the hollow space 36 of the threaded bore 30 and the screw 29 skids.

LIST OF REFERENCE CHARACTERS

1 Computer system
2 Housing
3 First circuit board
4 Connector
5 Second circuit board
6 Device (for attaching)
7 Plug connector
8 Mating plug connector
9 Fixing device
10 Lever
11 Force arm
12 Load arm
13 First projection
14 First pin
15 Second projection
16 Second pin
17 First rail
18 First opening
19 Fixing screw (of the first rail)
20 First lug
21 First bearing
22 Rotary axis
23 Screw spring
24 Second rail
25 Second opening
26 Fixing screw (of the second rail)
27 Second lug
28 Second bearing
29 Screw
30 Threaded bore
31 Screw head
32 Thread
33 Shaft
34 Tapered region
35 Inner thread
36 Hollow space
M Central region
R Peripheral region
S Region of the plug connection

The invention claimed is:
1. A computer system comprising,
a housing,
a first circuit board with at least one plug connector,
a retrofittable second circuit board with at least one mating plug connector, wherein during the retrofitting of the second circuit board, the second circuit board is inserted in the housing of the computer system in parallel to the first circuit board and a plug connection is formed, comprising the at least one plug connector and the at least one mating plug connector,
characterized in that
the second circuit board comprises devices for attaching, when retrofitting the second circuit board, at least one of its sides to the housing of the computer system,
the plug connection is located in a central region of the first circuit board and the second circuit board, respectively, wherein the central region describes a region of the first circuit board and the second circuit board where a force for closing or opening the plug connection is not applied exclusively by the devices, and
a fixing device is mounted in a region of the plug connection on the first circuit board and/or the second circuit board, wherein the fixing device is configured to apply a force for connecting the plug connection.

2. A computer system comprising,
a housing,
a first circuit board with at least one plug connector,
a retrofittable second circuit board with at least one mating plug connector, wherein during the retrofitting of the second circuit board, the second circuit board is inserted in the housing of the computer system in parallel to the first circuit board and a plug connection is formed, comprising the at least one plug connector and the at least one mating plug connector,
characterized in that
the second circuit board comprises devices for attaching, when retrofitting the second circuit board, at least one of its sides to the housing of the computer system,
the plug connection is located in a central region of the first circuit board and the second circuit board, respectively, wherein the central region describes a region of the first circuit board and the second circuit board where a force for closing or opening the plug connection is not applied exclusively by the devices, and
a fixing device, comprising a lever, is mounted in a region of the plug connection on the first circuit board and/or the second circuit board, wherein the lever, when actuated in a first direction, exerts force on the first circuit board and/or the second circuit board to connect the plug connection and, when actuated in a second direction, exerts force on the first circuit board and/or the second circuit board to release the plug connection.

3. The computer system according to claim 2, wherein the fixing device further comprises a first rail, which is mounted on the first circuit board and/or a second rail, which is mounted on the second circuit board and the lever is connected with the first rail and/or the second rail, respectively.

4. The computer system according to claim 3, wherein the lever comprises at least one first pin at a pivot point of the lever and the lever comprises at least one second pin on a load arm of the lever and the at least one first pin and the at least one second pin axially extend along or parallel to a rotational axis through the pivot point of the lever.

5. The computer system according to claim 4, wherein the first rail comprises at least one first bearing, into which the at least one first pin is inserted, and the second rail comprises at least one second bearing, into which the at least one second pin is inserted.

6. The computer system according to claim 5, wherein the at least one first pin is mounted axially in the direction of the rotational axis through the pivot point in the at least one first bearing and the lever is moveable along the rotational axis between a first and a second position, wherein
in the first position, the at least one second pin is inserted into the at least one second bearing, and
in the second position, the at least one second pin is not inserted into the at least one second bearing.

7. The computer system according to claim 6, wherein a helical spring surrounds the at least one first pin, which generates a restoring force in the direction of the rotational axis between the lever and the first rail, when the at least one first pin is inserted into the at least one first bearing of the first rail.

8. A computer system comprising,
a housing,
a first circuit board with at least one plug connector, a retrofittable second circuit board with at least one mating plug connector, wherein during the retrofitting of the second circuit board, the second circuit board is inserted in the housing of the computer system in parallel to the first circuit board and a plug connection is formed, comprising the at least one plug connector and the at least one mating plug connector, characterized in that the second circuit board comprises devices for attaching, when retrofitting the second circuit board, at least one of its sides to the housing of the computer system, the plug connection is located in a central region of the first circuit board and the second circuit board, respectively, wherein the central region describes a region of the first circuit board and the second circuit board where a force for closing or opening the plug connection is not applied exclusively by the devices, and a fixing device, comprising a threaded bore and a screw, is mounted in a region of the plug connection on the first circuit board and/or the second circuit board, wherein the threaded bore is arranged on the first circuit board and the screw is arranged on the second circuit board, and the screw, when being screwed into the threaded bore, applies a force for connecting the plug connection through a pre-tensioning force generated by the screw.

9. The computer system according to claim 8, wherein the screw is designed as a captive screw.

10. The computer system according to claim 8, wherein the screw is designed in such a way that a thread of the screw leaves an inner thread of the threaded bore and the screw spins when the plug connection is formed.

\* \* \* \* \*